United States Patent
Nakayama et al.

(10) Patent No.: US 10,091,868 B2
(45) Date of Patent: Oct. 2, 2018

(54) HEAT DISSIPATING SHEET AND HEAT DISSIPATING STRUCTURE USING SAME

(71) Applicant: Panasonic Intellectual Property Management Co., Ltd., Osaka (JP)

(72) Inventors: Masafumi Nakayama, Hokkaido (JP); Koji Matsuno, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/325,526

(22) PCT Filed: Sep. 9, 2015

(86) PCT No.: PCT/JP2015/004583
§ 371 (c)(1),
(2) Date: Jan. 11, 2017

(87) PCT Pub. No.: WO2016/042739
PCT Pub. Date: Mar. 24, 2016

(65) Prior Publication Data
US 2017/0156201 A1    Jun. 1, 2017

(30) Foreign Application Priority Data
Sep. 17, 2014  (JP) ................................ 2014-188961
Sep. 18, 2014  (JP) ................................ 2014-189616

(51) Int. Cl.
*H05K 1/00*     (2006.01)
*H05K 1/02*     (2006.01)
(Continued)

(52) U.S. Cl.
CPC .............. *H05K 1/0204* (2013.01); *F28F 3/12* (2013.01); *F28F 13/18* (2013.01); *F28F 21/067* (2013.01);
(Continued)

(58) Field of Classification Search
None
See application file for complete search history.

(56) References Cited

U.S. PATENT DOCUMENTS 5,034,802 A * 7/1991 Liebes, Jr. ............. H05K 3/303
257/672
7,928,590 B2   4/2011 Wolter et al.
(Continued)

FOREIGN PATENT DOCUMENTS

CN    1420558 A    5/2003
EP    0519620 A1   12/1992
(Continued)

OTHER PUBLICATIONS

International Search Report of PCT application No. PCT/JP2015/004583 dated Nov. 24, 2015.
(Continued)

*Primary Examiner* — Dimary Lopez Cruz
*Assistant Examiner* — Zhengfu Feng
(74) *Attorney, Agent, or Firm* — McDermott Will & Emery LLP

(57) ABSTRACT

A heat-dissipating sheet includes a thermally-conductive resin sheet, an adhesive layer on an upper surface of the thermally-conductive resin sheet, and a thermally-conductive film on an upper surface of the adhesive layer. The thermally-conductive film has a higher thermal conductivity than the thermally-conductive resin sheet. The thermally-conductive resin sheet has a thin portion that is locally thin to form a recess in a lower surface of the thermally-conductive resin sheet. The recess may be an aperture passing through the thermally-conductive resin sheet. The adhesive layer is exposed from the aperture.

30 Claims, 4 Drawing Sheets

(51) Int. Cl.
*H05K 1/18* (2006.01)
*F28F 21/06* (2006.01)
*F28F 3/12* (2006.01)
*F28F 13/18* (2006.01)

(52) U.S. Cl.
CPC ........ *H05K 1/185* (2013.01); *F28F 2275/025* (2013.01)

(56) References Cited

U.S. PATENT DOCUMENTS

| | | |
|---|---|---|
| 9,260,645 B2 | 2/2016 | Bruzda |
| 2003/0096116 A1 | 5/2003 | Mita et al. |
| 2003/0143452 A1 | 7/2003 | Ito et al. |
| 2003/0207128 A1 | 11/2003 | Uchiya et al. |
| 2009/0011245 A1 | 1/2009 | Tsai et al. |
| 2010/0132871 A1 | 6/2010 | Hattori et al. |
| 2010/0297453 A1 | 11/2010 | Maenaka et al. |
| 2010/0321897 A1 | 12/2010 | Hill et al. |
| 2012/0061135 A1 | 3/2012 | Hill et al. |
| 2013/0223041 A1* | 8/2013 | Arnold .................. H01L 23/552 361/818 |

FOREIGN PATENT DOCUMENTS

| | | | |
|---|---|---|---|
| JP | H11-074667 A | 3/1999 | |
| JP | 2001-044676 A | 2/2001 | |
| JP | 2001-291807 A | 10/2001 | |
| JP | 2001-358262 A | 12/2001 | |
| JP | 2003-145041 A | 5/2003 | |
| JP | 2003-158393 A | 5/2003 | |
| JP | 2008-272976 A | 11/2008 | |
| JP | 2010-024371 | 2/2010 | |
| JP | 2010-171350 A | 8/2010 | |
| JP | 2011-187899 A | 9/2011 | |
| JP | WO 2014024786 A1 * | 2/2014 | ............... G06F 1/18 |
| WO | 2012/036788 A2 | 3/2012 | |
| WO | 2014/024786 | 2/2014 | |

OTHER PUBLICATIONS

Non-Final Office Action issued in U.S. Appl. No. 14/778,583, dated Feb. 16, 2018.
English Translation of Chinese Search Report dated Jun. 28, 2016 for the related Chinese Patent Application No. 201480017887.3.
International Search Report of PCT application No. PCT/JP2014/001164 dated Jun. 10, 2014; with English translation.

* cited by examiner

HEAT DISSIPATING SHEET AND HEAT DISSIPATING STRUCTURE USING SAME This application is a U.S. national stage application of the PCT international application No.PCT/JP2015/004583 filed on Sep. 9, 2015, which claims the benefit of foreign priority of Japanese patent application No. 2014-188961 filed on Sep. 17, 2014 and Japanese patent application No. 2014-189616 filed on Sep. 18, 2014, the contents all of which are incorporated herein by reference.

TECHNICAL FIELD

The present disclosure relates to a heat-dissipating sheet used for various electronic devices, and to a heat-dissipating structure including the heat-dissipating sheet.

BACKGROUND ART

Various functions and process performance of recent electronic devices have been rapidly advanced, and thus the amount of heat from electronic components (e.g., semiconductor devices) increases. Accordingly, to maintain operating characteristics and reliability of semiconductor devices for example, a thermally-conductive sheet (produced by hardening a mixture of resin and a thermally-conductive filler) is made in contact with a heat-generating component to radiate or transfer the heat. Here, a heat-generating component refers to an electronic component that generates heat.

Note that a technology similar to the above-described thermally-conductive sheet is disclosed in PTL 1 for example.

CITATION LIST

Patent Literature

PTL 1: Japanese Patent Laid-Open Publication No. 2010-24371

SUMMARY

A heat-dissipating sheet includes a thermally-conductive resin sheet, an adhesive layer provided on an upper surface of the thermally-conductive resin sheet, and a thermally-conductive film provided on an upper surface of the adhesive layer. The thermally-conductive film has a larger thermal conductivity than the thermally-conductive resin sheet. The thermally-conductive resin sheet includes a thin portion that is locally thin to form a recess in a lower surface of the thermally-conductive resin sheet.

The recess may be an aperture passing through the thermally-conductive resin sheet. The adhesive layer is exposed from the aperture in the thermally-conductive resin sheet.

DETAIL DESCRIPTION OF PREFERRED EMBODIMENTS

The above conventional thermally-conductive sheet has a high heat resistance against a heat-generating component. The thermally-conductive sheet has unsatisfactory thermal conductivity, resulting in poor heat dissipation and transfer. To reduce the heat resistance while contacting, instead of using the thermally-conductive sheet, a mixture of liquid resin and a heat-conducting filler is applied to the heat-generating component and then hardened. In this case, the resin can hardly be removed from the printed circuit board. A liquid resin used for such a purpose is silicone containing siloxane, tending to contaminate, e.g. the inside of electronic devices.

A heat-dissipating sheet that solves the above problem will be described with referring to drawings.

Exemplary Embodiment 1

Figure 1:
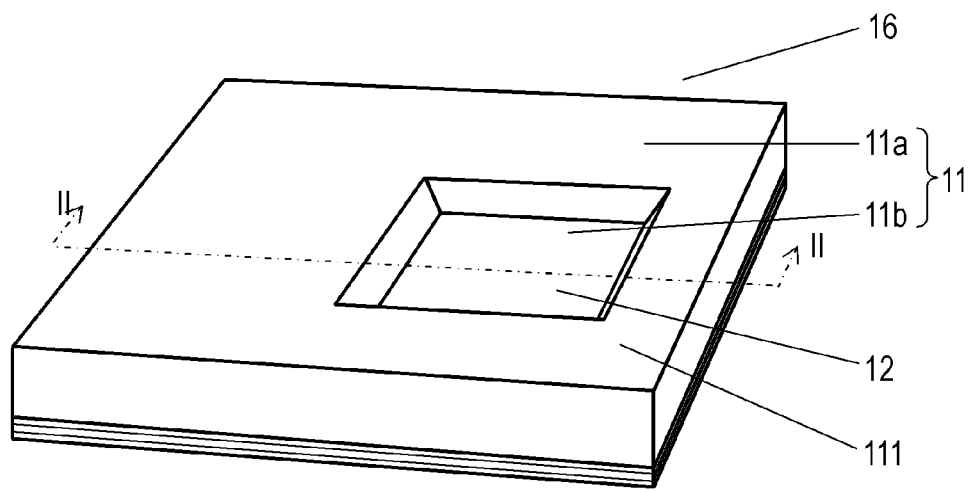
FIG. 1 is a bottom perspective view of a heat-dissipating sheet according to Exemplary Embodiment 1.
Figure 2:
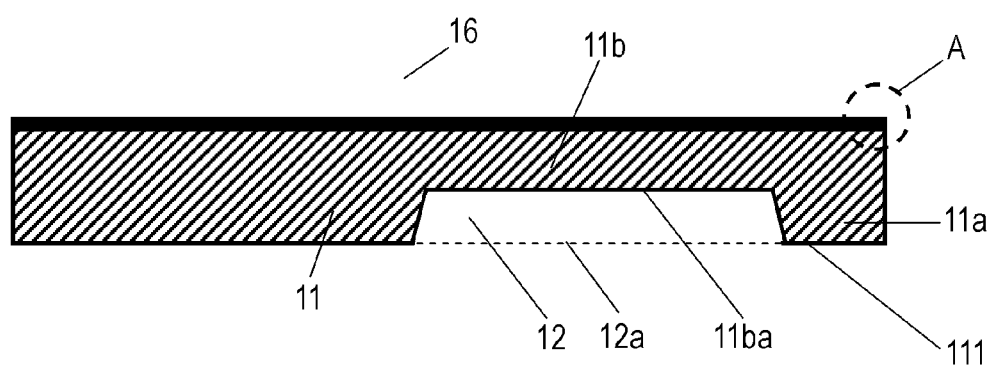
FIG. 2 is a sectional view of the heat-dissipating sheet along line II-II shown in FIG. 1.
Figure 3:
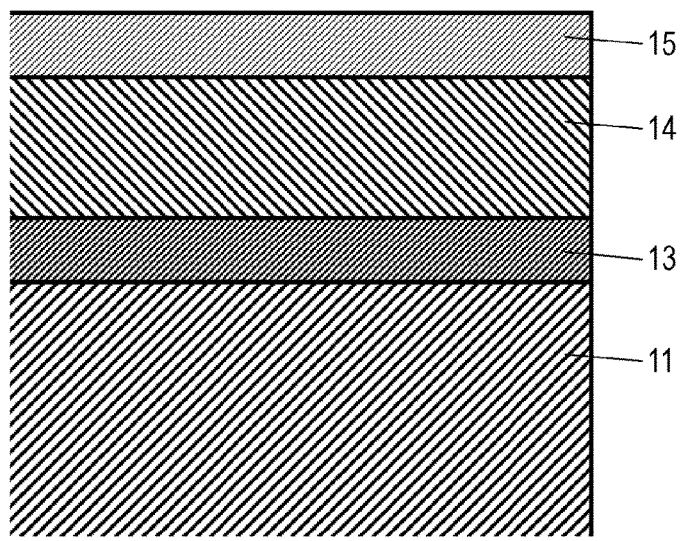
FIG. 3 is a partially-enlarged cross-sectional view of the heat-dissipating sheet shown in FIG. 2.

FIG. 1 is a bottom perspective view of heat-dissipating sheet 16 according to Exemplary Embodiment 1. FIG. 2 is a cross-sectional view of heat-dissipating sheet 16 along line II-II shown in FIG. 1. FIG. 3 is an enlarged cross-sectional view of part A of heat-dissipating sheet 16 shown in FIG. 2.

As shown in FIG. 3, heat-dissipating sheet 16 includes thermally-conductive resin sheet 11 and adhesive layer 13 which is a double-sided tape having a thickness of about 10 µm provided on an upper surface of thermally-conductive resin sheet 11. Thermally-conductive resin sheet 11 is made of styrene polymer and has a thickness of about 1.2 mm. Thermally-conductive film 14 made of a graphite film having a thickness of about 25 µm is provided on an upper surface of adhesive layer 13. Protective film 15 having a thickness of about 10 µm is provided on an upper surface of thermally-conductive film 14. Thermally-conductive resin sheet 11 is made of material plastically deforming at 25° C., and is made of styrene polymer that plastically deforms at 25° C. and does not contain siloxane.

As shown in FIG. 2, thermally-conductive resin sheet 11 has thin portion 11b that is locally thin to form recess 12 in lower surface 111 of the thermally-conductive resin sheet. Thin portion 11b is provided inside periphery 11a of the thermally-conductive resin sheet. Thin portion 11b has a thickness of about 0.5 mm while periphery 11a has a thickness of about 1.1 mm. A heat-generating component generating heat contacting an upper surface of thin portion 11b is securely attached to heat-dissipating sheet 16.

The above configuration allows thermally-conductive resin sheet 11 to be securely attached to an upper surface and a side surface of the heat-generating component when heat-dissipating sheet 16 according to Embodiment 1 is pressure-bonded to an upper surface of a printed circuit board having electronic components including the heat-generating component mounted thereon. This configuration reduces a heat resistance between the heat-generating component and thermally-conductive resin sheet 11.

The heat-generating component contacts and presses bottom surface 11ba of recess 12 (i.e., the lower surface of thin portion 11b), thereby attaching thermally-conductive resin sheet 11 securely to the heat-generating component while thermally-conductive resin sheet 11 deforms a little. This configuration reduces a pressure applied onto the heat-generating component and heat-dissipating sheet 16.

Thermally-conductive film 14 bonded to thermally-conductive resin sheet 11 that has a higher thermal conductivity than thermally-conductive resin sheet 11. Heat generated from the heat-generating component promptly transmits from thermally-conductive resin sheet 11 to thermally-conductive film 14 to be dissipated or transmitted, thus preventing a temperature rise of the heat-generating component. Thermally-conductive resin sheet 11 can be securely attached to the printed circuit board without the need of thermally hardening thermally-conductive resin sheet 11. This configuration facilitates removing heat-dissipating sheet 16 from the printed circuit board for reattaching heat-dissipating sheet 16.

The thickness of thin portion 11b is preferably not smaller than 5% and not larger than 70% of that of periphery 11a. The thickness of thin portion 11b exceeding 70% excessively increases a pressure pressurizing the heat-generating component and heat-dissipating sheet 16, and increases a pressure on the heat-generating component accordingly providing the heat-generating component with a load. Thin portion 11b having a thickness smaller than 5% of that of periphery 11a of thermally-conductive resin sheet 11 can be hardly fabricated.

Recess 12 has opening 12a opening in lower surface 111 of thermally-conductive resin sheet 11. The width of recess 12 provided in lower surface 111 of thermally-conductive resin sheet 11 may preferably taper from opening 12a of recess 12 toward bottom surface 11ba of recess 12, i.e., the lower surface of thin portion 11b.

The above configuration allows the heat-generating component to be easily attached to thermally-conductive resin sheet 11.

Thermally-conductive resin sheet 11 has an insulating property and can plastically deform at a temperature of 25° C. The plastic deformation here refers to deformation with an elastic recovery rate not larger than 50%. Elastic recovery rate RE is derived as follows. The surface of a test piece is depressed with an indenter having a predetermined shape. The indenter is pressed onto the test piece to a depth of 20% of the film thickness (x) at a constant pressure-increase rate and is held for one second. Then, the load is released at a constant pressure-decrease rate and is held for 30 seconds. After that, elastic recovery rate RE is determined by the following expression with film thickness (y) of the test piece.

$$RE\ (\%) = ((x)-(y))/(x) \times 100$$

The styrene polymer used in this embodiment has elastic recovery rate RE of about 30%. A common resin sheet made of styrene polymer elastically deforms with such a pressure. However, having a large amount of plasticizer mixed therein, such a resin sheet can have recovery rate RE not larger than 50%.

Thermally-conductive film 14 may preferably be made of a pyrolytic graphite film that is produced by thermally decomposing a polymer film. A pyrolytic graphite film has a thermal conductivity of 1600 W/m·K in the surface direction thereof, exhibiting preferable heat dissipation.

Thermally-conductive resin sheet 11 has a thermal conductivity of about 2 W/m·K. A higher thermal conductivity of thermally-conductive resin sheet 11 allows heat to transmit more efficiently. The thermal conductivity of thermally-conductive resin sheet 11 is preferably not smaller than 1 W/m·K. The thermal conductivity of resin, however, is usually low, and thus thermally-conductive resin sheet 11 does not exhibit high thermal conductivity. According to this embodiment, thermally-conductive film 14 with a thermal conductivity much higher than thermally-conductive resin sheet 11 is bonded to thermally-conductive resin sheet 11 to allow heat to be rapidly diffused in directions on the surface of thermally-conductive film 14.

The above configuration allows heat-dissipating sheet 16 according to this embodiment to adequately dissipate or transmit heat even including thermally-conductive resin sheet 11 with a thermal conductivity of about 2 W/m·K. The thermal conductivity of thermally-conductive film 14 is preferably not smaller than 100 times that of thermally-conductive resin sheet 11.

In heat-dissipating sheet 16 according to this embodiment, thin portion 11b that is locally thin to form recess 12 contacts a heat-generating component and is pressurized, thereby causing thermally-conductive resin sheet 11 to plastically deform and to be securely attached to the heat-generating component.

The above configuration of heat-dissipating sheet 16 according to this embodiment allows thermally-conductive resin sheet 11 to be securely attached to the entire upper surface and a side surface of the heat-generating component.

A thermally-conductive resin sheet having a flat main surface without thin portion 11b requires a larger pressure to plastically deform than heat-dissipating sheet 16 according to this embodiment. In heat-dissipating sheet 16 according to this embodiment, however, thin portion 11b that is locally thin to form recess 12 contacts a heat-generating component and is pressurized, allowing the heat-generating component to be securely attached to thermally-conductive resin sheet 11 adequately with a small pressure.

The width of recess 12 provided in lower surface 111 of thermally-conductive resin sheet 11 preferably tapers from opening 12a toward bottom surface 11ba of recess 12.

The above configuration causes the heat-generating component to be easily attached securely to thermally-conductive resin sheet 11.

Before the heat-generating component is inserted into recess 12, bottom surface 11ba of recess 12 is preferably narrower than the heat-generating component. Bottom surface 11ba of recess 12 narrower than the heat-generating component allows the entire upper surface and the side surface of the heat-generating component to be securely attached to thermally-conductive resin sheet 11 more reliably. Bottom surface 11ba of recess 12 is preferably narrower than the heat-generating component by a size ranging from 0.5 mm to 2.0 mm, and opening 12a of recess 12 is preferably larger than the heat-generating component by a size ranging from 0.5 mm to 2.0 mm.

In the case where bottom surface 11ba of recess 12 is narrower than the heat-generating component, air may enter into a space between the upper surface of the heat-generating component and bottom surface 11ba of recess 12 when the heat-generating component is inserted into recess 12 and is pressurized, and prevents the heat-generating component from being securely attached to bottom surface 11ba of recess 12. In this case, the heat-generating component contacts bottom surface 11ba of recess 12 successively from one side surface toward the other while thermally-conductive resin sheet 11 is bent, thereby preventing air from entering into the space between the upper surface of the heat-generating component and bottom surface 11ba of recess 12. This operation provides a heat-dissipating sheet that allows the upper surface of the heat-generating component to be securely attached to bottom surface 11ba of recess 12.

Otherwise, a ventilating aperture passing through heat-dissipating sheet 16 from lower surface 111 of thermally-conductive resin sheet 11 may be provided in thermally-conductive resin sheet 11 as to prevent air from entering into a space between the upper surface of the heat-generating component and bottom surface 11ba of recess 12. This configuration provides a heat-dissipating sheet in which the upper surface of the heat-generating component is securely attached to bottom surface 11ba of recess 12.

The above configuration allows the heat-generating component to be securely attached to thermally-conductive resin sheet 11 more easily.

Periphery 11a of thermally-conductive resin sheet 11 preferably has a thickness ranging from 0.5 mm to 2.0 mm.

The above configuration allows thermally-conductive resin sheet 11 to be securely attached to the heat-generating component adequately, providing heat-dissipating sheet 16 with high heat dissipation.

The depth of recess 12 preferably ranges from 80% to 95% of the height of the heat-generating component. The depth of recess 12 refers to the distance from bottom surface 11ba of recess 12 to lower surface 111 of conductive resin sheet 11.

When thermally-conductive resin sheet 11 contacts the heat-generating component and is pressurized, the above configuration decreases the pressure on the heat-generating component while thermally-conductive resin sheet 11 is securely attached to the heat-generating component stably.

As shown in FIG. 3, insulative protective film 15 may be previously bonded to the upper surface of thermally-conductive film 14.

The above configuration provides preferably insulating property of the surface of heat-dissipating sheet 16 while preventing heat-dissipating sheet 16 from being damaged due to an external stress. Protective film 15 may be a double-sided tape with adhesive on both sides. Protective film 15 which is a double-sided tape allows heat-dissipating sheet 16 to be connected to a housing or a heat sink to dissipate or transmit heat more effectively.

A heat-dissipating structure with heat-dissipating sheet 16 according to Embodiment 1 will be described below. The heat-dissipating structure refers to a structure produced by bonding heat-dissipating sheet 16 to a printed circuit board.

Figure 4:
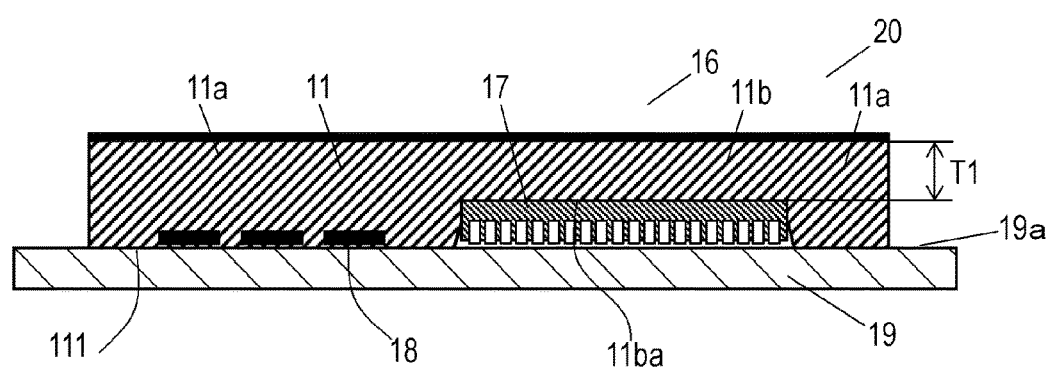
FIG. 4 is a cross-sectional view of a heat-dissipating structure including the heat-dissipating sheet shown in FIG. 2 and a printed circuit board on the heat-dissipating sheet.

FIG. 4 is a cross-sectional view of heat-dissipating structure 20 including heat-dissipating sheet 16 according to Embodiment 1.

Heat-generating component 17, such as an integrated circuit (IC), and other electronic components 18 are mounted onto upper surface 19a of printed circuit board 19. Heat-generating component 17 has a height of about 1 mm. Heat-dissipating sheet 16 is produced by bonding thermally-conductive film 14 to thermally-conductive resin sheet 11 having a thickness of about 1.3 mm.

In heat-dissipating structure 20, upper surface 19a of printed circuit board 19 contacts lower surface 111 of thermally-conductive resin sheet 11 and is pressurized to cause thermally-conductive resin sheet 11 plastically deform. Thermally-conductive resin sheet 11 contacts the entire upper surface of heat-generating component 17, the side surface connected to the upper surface and the lower surface of heat-generating component 17, and upper surface 19a of printed circuit board 19.

Recess 12 of thermally-conductive resin sheet 11 preferably contacts with more than half the side surface of heat-generating component 17 from the upper surface to the bottom surface of heat-generating component 17.

When an elastic thermally-conductive resin sheet contacts heat-generating component 17 and is pressurized, in contrast to thermally-conductive resin sheet 11 according to this embodiment, thermally-conductive resin sheet 11 contacts the upper surface of the heat-generating component while thermally-conductive resin sheet 11 cannot sufficiently contact the side surface of heat-generating component 17 due to a spring-back effect. Meanwhile, in thermally-conductive resin sheet 11 according to this embodiment, the upper surface of heat-generating component 17 contacts thin portion 11b that is locally thin to form a recess and is pressurized, and thus the side surface of heat-generating component 17 can be securely attached to thermally-conductive resin sheet 11 with a small pressure. Further, the thickness of periphery 11a of thermally-conductive resin sheet 11 before being bonded to printed circuit board 19 is larger than the height of heat-generating component 17, thus allowing thermally-conductive resin sheet 11 to contact printed circuit board 19.

The above configuration allows most of the heat generated in heat-generating component 17 to transmit from the upper surface of heat-generating component 17 through thermally-conductive resin sheet 11 to thermally-conductive film 14. Part of the heat can transmit from the side surface of heat-generating component 17 through thermally-conductive resin sheet 11 to printed circuit board 19.

As shown in FIG. 4, thickness T1 of thin portion 11b of thermally-conductive resin sheet 11 after plastically deforming is about 0.4 mm. A smaller thickness T1 of thin portion 11b allows heat generated from heat-generating component 17 to preferably transmit to thermally-conductive film 14 rapidly. Thickness T1 of thin portion 11b is preferably larger than 0 mm and not larger than 0.5 mm. This configuration provides practically preferably heat radiation.

Heat-dissipating sheet 16 can be bonded to printed circuit board 19 by pressurizing heat-dissipating sheet 16 with a roller or pressing the upper surface of heat-dissipating sheet 16 with an elastic body. In either way, protective film 15 may be previously provided on thermally-conductive film 14. A tensile strength of protective film 15 is preferably larger than that of thermally-conductive film 14. This configuration prevents heat-dissipating sheet 16 from breaking when printed circuit board 19 is pressurized.

Heat-dissipating structure 20 according to this embodiment can dissipate or transmit heat much more efficiently than a conventional thermally-conductive sheet.

Exemplary Embodiment 2

Figure 5:
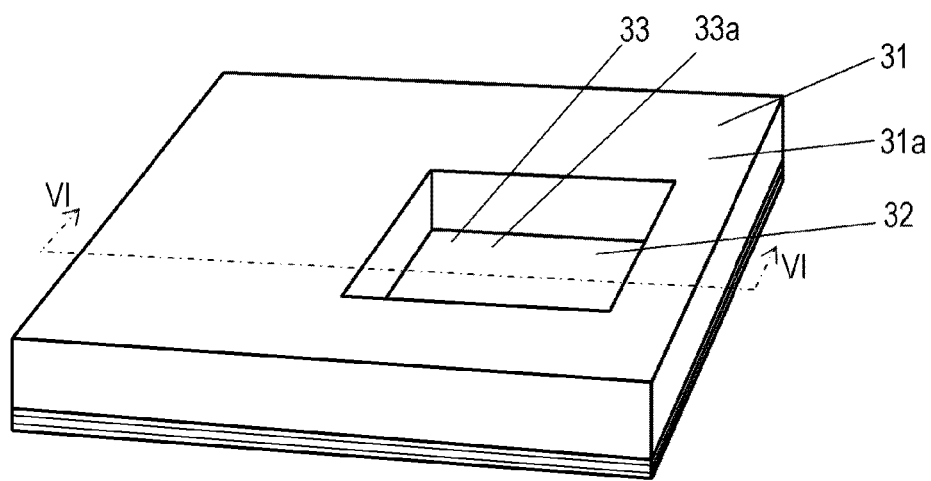
FIG. 5 is a perspective view of a heat-dissipating sheet according to Exemplary Embodiment 2.
Figure 6:
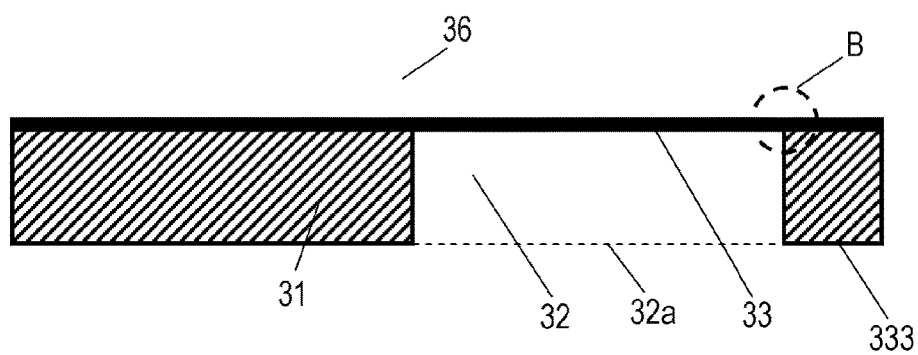
FIG. 6 is a cross-sectional view of the heat-dissipating sheet along line VI-VI shown in FIG. 5.
Figure 7:
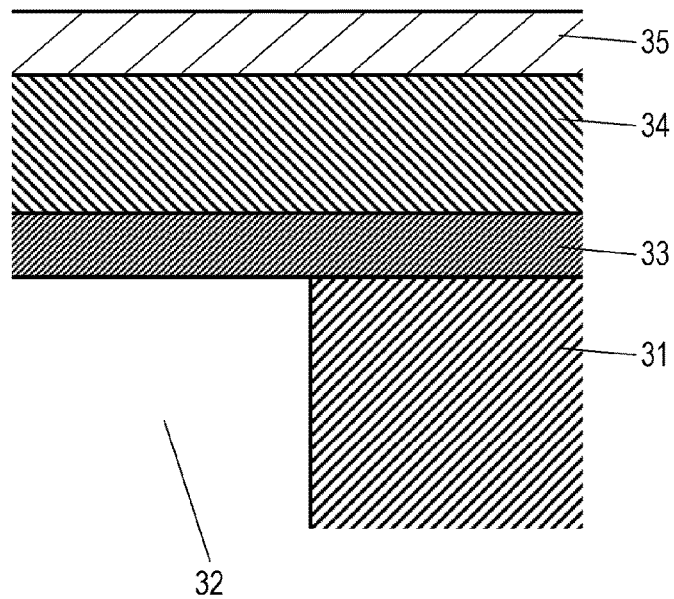
FIG. 7 is a partially-enlarged cross-sectional view of the heat-dissipating sheet shown in FIG. 6.

FIG. 5 is a perspective view of heat-dissipating sheet 36 according to Exemplary Embodiment 2. FIG. 6 is a cross-sectional view of heat-dissipating sheet 36 along line VI-VI shown in FIG. 5. FIG. 7 is an enlarged cross-sectional view of part B of heat-dissipating sheet 36 shown in FIG. 6. Heat-dissipating sheet 36 according to Embodiment 2 shown in FIG. 5 has aperture 32 provided in bottom surface 11ba (thin portion 11b) of recess 12 of heat-dissipating sheet 16 according to Embodiment 1.

As shown in FIG. 7, heat-dissipating sheet 36 includes adhesive layer 33 on an upper surface of thermally-conductive resin sheet 31 made of styrene polymer and having a thickness of about 1.2 mm. Adhesive layer 33 is a double-sided tape having a thickness of 10 μm. Thermally-conductive film 34 which is a graphite film having a thickness of about 25 µm provided on an upper surface of adhesive layer 33. Protective film 35 having a thickness of about 10 µm is provided on an upper surface of thermally-conductive film 34. Thermally-conductive resin sheet 31 is made of a material plastically deforming at a temperature of 25° C., and is made of styrene polymer plastically deforming at a temperature of 25° C. and not containing siloxane.

Adhesive layer 33 is exposed from aperture 32 of thermally-conductive resin sheet 31.

Heat-dissipating sheet 36 contacts the heat-generating component mounted on the printed circuit board such that the heat-generating component is disposed into aperture 32 while a pressure is applied to thermally-conductive resin sheet 31 plastically deform thermally-conductive resin sheet 31. The upper surface of the heat-generating component is bonded to exposed surface 33a of adhesive layer 33 exposed from aperture 32. Thermally-conductive resin sheet 31 plastically deforms and contacts the side surface of the heat-generating component and the printed circuit board, thus being securely attached to the heat-generating component and the printed circuit board.

The above configuration of heat-dissipating sheet 36 according to Embodiment 2 allows heat generated in the heat-generating component to be dissipated or transmitted in directions on the surface of thermally-conductive film 34 made of a graphite film through adhesive layer 33. Simultaneously, heat-dissipating sheet 36 allows the heat to be dissipated or transmitted from the side surface of the heat-generating component through thermally-conductive resin sheet 31 to the printed circuit board.

Thermally-conductive resin sheet 31 has an insulating property and is plastically deformable at a temperature of 25° C. Plastic deformation refers to deformation with an elastic recovery rate not higher than 50%. The definition of the elastic recovery rate and its measurement method are the same as those of Embodiment 1, and their description is omitted.

The styrene polymer used for thermally-conductive resin sheet 31 according to Embodiment 2 has an elastic recovery rate of about 30%, which is the same as that used for thermally-conductive resin sheet 11 according to Embodiment 1.

The heat conductivities of thermally-conductive film 34 and thermally-conductive resin sheet 31 are the same as those of Embodiment 1, and their description is omitted.

Before the heat-generating component is inserted into aperture 32, exposed surface 33a of adhesive layer 33 is preferably larger than the heat-generating component, hence allowing the upper surface of the heat-generating component to be securely attached to exposed surface 33 of adhesive layer 33 more reliably. In this case, the entire side surface of the heat-generating component may not necessarily be attached securely to thermally-conductive resin sheet 31, but at least a part of the side surface of the heat-generating component may be securely attached to thermally-conductive resin sheet 31.

Exposed surface 33a of adhesive layer 33 is preferably smaller than the heat-generating component by a size ranging from 0.5 mm to 2.0 mm.

The above configuration allows the heat-generating component to be securely attached to thermally-conductive resin sheet 31 more easily. Periphery 31a of thermally-conductive resin sheet 31 preferably has a thickness ranging from 0.5 mm to 2.0 mm.

This configuration allows thermally-conductive resin sheet 31 to be securely attached to the heat-generating component, providing heat-dissipating sheet 36 with high heat dissipation.

As shown in FIG. 7, it is more preferable that insulative protective film 35 may be previously bonded to the upper surface of thermally-conductive film 34.

The above configuration provides the surface of heat-dissipating sheet 36 with preferably insulating property while preventing heat-dissipating sheet 36 from being damaged due to an external stress. Protective film 35 may be a double-sided tape with adhesive on both sides thereof.

Protective film 35, the double-sided tape allows heat-dissipating sheet 36 to be connected to a housing or a heat sink to efficiently dissipate or transmit heat.

A heat-dissipating structure including heat-dissipating sheet 36 according to Embodiment 2 will be described below. The heat-dissipating structure refers to a structure produced by bonding heat-dissipating sheet 36 to a printed circuit board.

Figure 8:
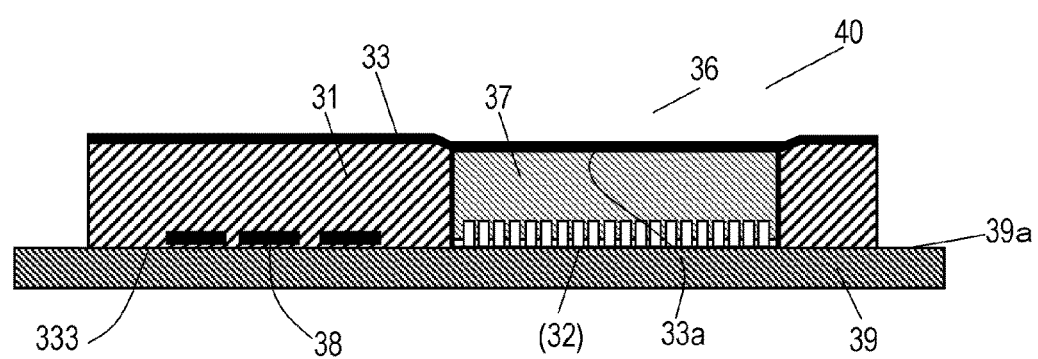
FIG. 8 is a cross sectional view of a heat-dissipating structure including the heat-dissipating sheet shown in FIG. 6 and a printed circuit board on the heat-dissipating sheet.

FIG. 8 is a cross-sectional view of heat-dissipating structure 40 including heat-dissipating sheet 36 according to Embodiment 2.

Heat-generating component 37, such as an integrated circuit (IC), and other electronic components 38 are mounted onto printed circuit board 39. Heat-generating component 37 has a height of about 1 mm. Heat-dissipating sheet 36 is produced by bonding thermally-conductive film 34 to thermally-conductive resin sheet 31 having a thickness of about 1.2 mm.

In heat-dissipating structure 40, upper surface 39a of printed circuit board 39 contacts lower surface 333 of thermally-conductive resin sheet 31 and is pressurized to cause thermally-conductive resin sheet 31 to plastically deform. Thermally-conductive resin sheet 31 is securely attached to the entire upper surface and the side surface of heat-generating component 37 and upper surface 39a of printed circuit board 39.

Before heat-generating component 37 is inserted into aperture 32, exposed surface 33a of adhesive layer 33 of thermally-conductive resin sheet 31 may be larger than the upper surface of heat-generating component 37.

Then, thermally-conductive resin sheet 31 is positioned such that heat-generating component 37 is disposed into aperture 32 of thermally-conductive resin sheet 31. Next, lower surface 333 of thermally-conductive resin sheet 31 contacts upper surface 39a of printed circuit board 39 and is pressurized to cause thermally-conductive resin sheet 31 to plastically deform and to be to printed circuit board 39.

The above configuration allows thermally-conductive resin sheet 31 to plastically deform, allows the upper surface of heat-generating component 37 to be bonded to exposed surface 33a of adhesive layer 33 of thermally-conductive film 34, and allows the side surface of heat-generating component 37 and upper surface 39a of printed circuit board 39 to be securely attached to thermally-conductive resin sheet 31.

The aperture in thermally-conductive resin sheet 31 may preferably contact more than a half part of the side surface of heat-generating component 37 from the upper surface to the bottom surface of heat-generating component 37.

The above configuration allows more heat to transmit from the side surface of heat-generating component 37 as well.

As described above, in heat-dissipating sheet 36 according to Embodiment 2, most of the heat generated in heat-generating component 37 transmits from the upper surface of heat-generating component 37 through thermally-conductive resin sheet 31 to thermally-conductive film 34. Part of the heat transmits from the side surface of heat-generating component 37 as well to thermally-conductive resin sheet 31, and further to printed circuit board 39. Heat-dissipating sheet 36 can dissipate or transmit heat more efficiently than a conventional thermally-conductive sheet.

Heat-dissipating sheet 36 is bonded to printed circuit board 39 by pressurizing heat-dissipating sheet 36 with a roller or by pressing the upper surface of heat-dissipating sheet 36 with an elastic body. In this case, it is preferable that protective film 35 is previously provided on thermally-conductive film 34. A tensile strength of protective film 35 is preferably larger than that of thermally-conductive film 34.

The above configuration prevents heat-dissipating sheet 36 from breaking when printed circuit board 39 is pressurized.

In the embodiments, terms, such as "upper surface" and "bottom surface", indicating directions indicate relative directions determined only by positional relationship of components of the heat-dissipating sheet and the printed circuit board, and do not indicate absolute directions.

INDUSTRIAL APPLICABILITY

A heat-dissipating sheet and a heat-dissipating structure including the heat-dissipating sheet according to the present disclosure allow heat generated in a heat-generating component to dissipate or transmit efficiently and are easily detached from a printed circuit board, and thus are industrially useful.

REFERENCE MARKS IN THE DRAWINGS 11 thermally-conductive resin sheet
11a periphery
11b thin portion
11ba bottom surface
12 recess
12a opening
13 adhesive layer
14 thermally-conductive film
15 protective film
16 heat-dissipating sheet
17 heat-generating component
18 electronic component
19 printed circuit board
20 heat-dissipating structure
31 thermally-conductive resin sheet
31a periphery
32 aperture
33 adhesive layer
33a exposed surface
34 thermally-conductive film
35 protective film
36 heat-dissipating sheet
37 heat-generating component
38 electronic component
39 printed circuit board
40 heat-dissipating structure

The invention claimed is:
1. A heat-dissipating sheet comprising:
a thermally-conductive resin sheet;
an adhesive layer provided on an upper surface of the thermally-conductive resin sheet; and
a thermally-conductive film provided on an upper surface of the adhesive layer, the thermally-conductive film having a thermal conductivity higher than a thermal conductivity of the thermally-conductive resin sheet,
wherein the thermally-conductive resin sheet has a thin portion that is locally thin to form a recess in a lower surface of the thermally-conductive resin sheet, and
wherein the thermally-conductive resin sheet is made of a material that does not contain siloxane and is plastically deformed at 25° C.

2. The heat-dissipating sheet of claim 1, wherein a thickness of the thin portion is not smaller than 5% and not larger than 70% of a thickness of a periphery of the thermally-conductive resin sheet.

3. The heat-dissipating sheet of claim 1, wherein a width of the recess tapers from the lower surface of the thermally-conductive resin sheet toward a bottom surface of the recess.

4. The heat-dissipating sheet of claim 1,
wherein the recess is an aperture passing through the thermally-conductive resin sheet, and
wherein the adhesive layer is exposed from the aperture of the thermally-conductive resin sheet.

5. The heat-dissipating sheet of claim 1, wherein the recess is provided more inwardly than a periphery of the thermally-conductive resin sheet.

6. The heat-dissipating sheet of claim 1, wherein the thermally-conductive resin sheet is made of styrene polymer.

7. A heat-dissipating sheet comprising:
a thermally-conductive resin sheet;
an adhesive layer provided on an upper surface of the thermally-conductive resin sheet; and
a thermally-conductive film provided on an upper surface of the adhesive layer, the thermally-conductive film having a thermal conductivity higher than a thermal conductivity of the thermally-conductive resin sheet,
wherein the thermally-conductive resin sheet has a thin portion that s locally thin to form a recess in a lower surface of the thermally-conductive resin sheet,
wherein the recess is an aperture passing through the thermally-conductive resin sheet, and
wherein the adhesive layer is exposed from the aperture of the thermally-conductive resin sheet,
wherein the aperture is configured to allow a heat-generating component to be inserted into the aperture, and
wherein a size of a surface of the adhesive layer exposed from the aperture is larger than a size of an upper surface of the heat-generating component.

8. A heat-dissipating sheet comprising:
a thermally-conductive resin sheet;
an adhesive layer provided on an upper surface of the thermally-conductive resin sheet; and
a thermally-conductive film provided on an upper surface of the adhesive layer, the thermally-conductive film having a thermal conductivity higher than a thermal conductivity of the thermally-conductive resin sheet,
wherein the thermally-conductive resin sheet has a thin portion that is locally thin to form a recess in a lower surface of the thermally-conductive resin sheet,
wherein the recess is configured to allow a heat-generating component to be inserted into the recess, and
wherein a size of a bottom surface of the recess is smaller than a size of the upper surface of the heat-generating component.

9. A heat-dissipating structure comprising:
a printed circuit board, a heat-generating component mounted on an upper surface of the printed circuit board, and
a heat-dissipating sheet,
wherein the heat-dissipating sheet includes:
a thermally-conductive resin sheet,
an adhesive layer provided on an upper surface of the thermally-conductive resin sheet, and
a thermally-conductive film that is provided on an upper surface of the adhesive layer and has a thermal conductivity higher than a thermal conductivity of the thermally-conductive resin sheet,
wherein the thermally-conductive resin sheet having a recess provided in a lower surface of the thermally-conductive resin sheet, the recess having a bottom surface contacting an upper surface of the heat-generating component,
wherein the thermally-conductive resin sheet includes a thin portion locally thin to form the recess,
wherein the thermally-conductive resin sheet contacts at least a part of the upper surface of the printed circuit board, an entirety of the upper surface of the heat-generating component, and a half or more of a side surface of the heat-generating component from the upper surface to the lower surface of the heat-generating component,
wherein the recess is an aperture passing through the thermally-conductive resin sheet,
wherein the adhesive layer is exposed from the aperture of the thermally-conductive resin sheet, and
wherein the heat-generating component contacts the adhesive layer exposed from the aperture and is bonded to the adhesive layer.

10. The heat-dissipating structure of claim 9, wherein a size of the bottom surface of the recess is smaller than a size of the upper surface of the heat-generating component, with the heat-generating component outside the recess.

11. The heat-dissipating structure of claim 9, wherein a thickness of the thin portion is between 5% and 70% inclusive of a thickness of a periphery of the thermally-conductive resin sheet.

12. The heat-dissipating structure of claim 9, wherein, while the heat-generating component is not inserted in recess, a size of a surface of the adhesive layer exposed from the aperture is larger than a size of the upper surface of the heat-generating component.

13. The heat-dissipating structure of claim 9, wherein the recess is provided more inwardly than a periphery of the thermally-conductive resin sheet.

14. The heat-dissipating structure of claim 9, wherein the thermally-conductive resin sheet is made of styrene polymer.

15. A heat-dissipating structure comprising:
a printed circuit board,
a heat-generating component mounted on an upper surface of the printed circuit board, and
a heat-dissipating sheet,
wherein the heat-dissipating sheet includes:
a thermally-conductive resin sheet,
an adhesive layer provided on an upper surface of the thermally-conductive resin sheet, and
a thermally-conductive film that is provided on an upper surface of the adhesive layer and has a thermal conductivity higher than a thermal conductivity of the thermally-conductive resin sheet,
wherein the thermally-conductive resin sheet having a recess provided in a lower surface of the thermally-conductive resin sheet, the recess having a bottom surface contacting an upper surface of the heat-generating component,
wherein the thermally-conductive resin sheet includes a thin portion locally thin to form the recess,
wherein the thermally-conductive resin sheet contacts at least a part of the upper surface of the printed circuit board, an entirety of the upper surface of the heat-generating component, and a half or more of a side surface of the heat-generating component from the upper surface to the lower surface of the heat-generating component, and
wherein a size of the bottom surface of the recess is smaller than a size of the upper surface of the heat-generating component, with the heat-generating component outside the recess.

16. A heat-dissipating sheet comprising:
a thermally-conductive resin sheet;
an adhesive layer provided on an upper surface of the thermally-conductive resin sheet; and
a thermally-conductive film provided on an upper surface of the adhesive layer, the thermally-conductive film having a thermal conductivity higher than a thermal conductivity of the thermally-conductive resin sheet,
wherein the thermally-conductive resin sheet has a thin portion that is locally thin to form a recess in a lower surface of the thermally-conductive resin sheet,
wherein the recess is an aperture passing through the thermally-conductive resin sheet, and
wherein a portion of a lower surface of the adhesive layer is exposed from the aperture of the thermally-conductive resin sheet.

17. The heat-dissipating sheet of claim 16, wherein a thickness of the thin portion is not smaller than 5% and not larger than 70% of a thickness of a periphery of the thermally -conductive resin sheet.

18. The heat-dissipating sheet of claim 16, wherein a width of the recess tapers from the lower surface of the thermally-conductive resin sheet toward a bottom surface of the recess.

19. The heat-dissipating sheet of claim 16, wherein the recess is provided more inwardly than a periphery of the thermally-conductive resin sheet.

20. The heat-dissipating sheet of claim 16, wherein the thermally-conductive resin sheet is made of a material that does not contain siloxane and is plastically deformed at 25° C.

21. The heat-dissipating sheet of claim 16, wherein the thermally-conductive resin sheet is made of styrene polymer.

22. The heat-dissipating sheet of claim 16,
wherein the aperture is configured to allow a heat-generating component to be inserted into the aperture, and
wherein a size of a surface of the adhesive layer exposed from the aperture is larger than a size of an upper surface of the heat-generating component.

23. The heat-dissipating sheet of claim 16,
wherein the recess is configured to allow a heat-generating component to be inserted into the recess, and
wherein a size of a bottom surface of the recess is smaller than a size of the upper surface of the heat-generating component.

24. A heat-dissipating structure comprising:
a printed circuit board,
a heat-generating component mounted on an upper surface of the printed circuit board, and
a heat-dissipating sheet, wherein the heat-dissipating sheet includes:
a thermally-conductive resin sheet,
an adhesive layer provided on an upper surface of the thermally-conductive resin sheet, and
a thermally-conductive film that is provided on an upper surface of the adhesive layer and has a thermal conductivity higher than a thermal conductivity of the thermally-conductive resin sheet,
wherein the thermally-conductive resin sheet having a recess provided in a lower surface of the thermally-conductive resin sheet, the recess having a bottom surface contacting an upper surface of the heat-generating component,
wherein the thermally-conductive resin sheet includes a thin portion locally thin to form the recess,
wherein the thermally-conductive resin sheet contacts at least a part of the upper surface of the printed circuit board, an entirety of the upper surface of the heat-generating component, and a half or more of a side surface of the heat-generating component from the upper surface to the lower surface of the heat-generating component, and
wherein the thermally-conductive resin sheet is made of a material that does not contain siloxane and is plastically deformed at 25° C.

25. The heat-dissipating structure of claim 24, wherein a size of the bottom surface of the recess is smaller than a size of the upper surface of the heat-generating component, with the heat-generating component outside the recess.

26. The heat-dissipating structure of claim 24, wherein a thickness of the thin portion is between 5% and 70% inclusive of a thickness of a periphery of the thermally-conductive resin sheet.

27. The heat-dissipating structure of claim 24,
wherein the recess is an aperture passing through the thermally-conductive resin sheet,
wherein the adhesive layer is exposed from the aperture of the thermally-conductive resin sheet, and
wherein the heat-generating component contacts the adhesive layer exposed from the aperture and is bonded to the adhesive layer.

28. The heat-dissipating structure of claim 27, wherein, while the heat-generating component is not inserted in recess, a size of a surface of the adhesive layer exposed from the aperture is larger than a size of the upper surface of the heat-generating component.

29. The heat-dissipating structure of claim 24, wherein the recess is provided more inwardly than a periphery of the thermally-conductive resin sheet.

30. The heat-dissipating structure of claim 24, wherein the thermally-conductive resin sheet is made of styrene polymer.

* * * * *